United States Patent
Tu et al.

(10) Patent No.: US 8,093,653 B2
(45) Date of Patent: Jan. 10, 2012

(54) TRENCH METAL OXIDE-SEMICONDUCTOR TRANSISTOR AND FABRICATION METHOD THEREOF

(75) Inventors: Kao-Way Tu, Taipei County (TW); Cheng-Hui Tung, Taipei County (TW); Hsiao-Wei Tsai, Taichung County (TW)

(73) Assignee: Niko Semiconductor Co., Ltd., Taipei (TW)

( * ) Notice: Subject to any disclaimer, the term of this patent is extended or adjusted under 35 U.S.C. 154(b) by 641 days.

(21) Appl. No.: 12/243,406

(22) Filed: Oct. 1, 2008

(65) Prior Publication Data
US 2010/0078714 A1    Apr. 1, 2010

(51) Int. Cl.
*H01L 29/78* (2006.01)
*H01L 21/336* (2006.01)

(52) U.S. Cl. ........................................................ 257/330

(58) Field of Classification Search ................ 257/331, 257/320, 328, 329, 270, 271, E21.345, E29.133, 257/E21.418, E29.02, E29.066, E29.257, 257/E21.419, E29.121, E29.26, 341, 301, 257/330; 438/40, 24, 270, 494, 498, 634, 438/669–673, 924, 940
See application file for complete search history.

(56) References Cited

U.S. PATENT DOCUMENTS

| | | | | |
|---|---|---|---|---|
| 6,627,499 B2 * | 9/2003 | Osawa | ........................... | 438/259 |
| 6,838,735 B1 * | 1/2005 | Kinzer et al. | ................... | 257/365 |
| 7,115,944 B2 * | 10/2006 | Nakamura et al. | ............ | 257/328 |
| 7,400,014 B2 * | 7/2008 | Thapar | ............................ | 257/330 |
| 7,592,228 B2 * | 9/2009 | Williams et al. | ............... | 438/270 |
| 2007/0267672 A1 * | 11/2007 | Hokomoto et al. | ............ | 257/301 |

* cited by examiner

*Primary Examiner* — Dao H Nguyen
*Assistant Examiner* — Tram H Nguyen
(74) *Attorney, Agent, or Firm* — Rosenberg, Klein & Lee

(57) ABSTRACT

A fabrication method of a trench metal oxide-semiconductor (MOS) transistor is provided. After the gate trenches are formed in the epitaxial layer, impurities of a first conductive type are implanted into the epitaxial layer by using a blanket implantation process. A polysilicon pattern filling the gate trenches and covering a predetermined range of epitaxial layer surrounding the gate trenches is formed on the epitaxial layer. Impurities of a second conductive type are implanted through the polysilicon pattern into the epitaxial layer to form a well. Impurities of the first conductive type are implanted to form a plurality of first doping regions. A portion of the polysilicon layer above the upper surface of the epitaxial layer is removed by etching to form a plurality of polysilicon gates. Impurities in the first doping regions are driven in to form a plurality of source regions adjacent to the gate trenches.

21 Claims, 13 Drawing Sheets

TRENCH METAL OXIDE-SEMICONDUCTOR TRANSISTOR AND FABRICATION METHOD THEREOF

BACKGROUND OF THE INVENTION

1. Field of the Invention

This invention relates to a metal oxide semiconductor transistor and a fabrication method thereof, and more particularly relates to a trench metal oxide semiconductor transistor and a fabrication method thereof.

2. Description of Related Art

In order to catch up the requirements of power saving and low energy loss, converters with higher power conversion efficiency, which brings the circuit designers a more severe challenge, are unpreventable. To overcome this challenge, the newly developed power elements play an important role. In present, the power metal oxide semiconductor field effect transistor (MOSFET) has been widely adopted to various power converters.

Energy loss of the power metal oxide semiconductor field effect transistor (MOSFET) includes conduction loss resulted from on-resistance and energy loss resulted from inter-electrode capacitance (including output capacitance Ciss and reverse transfer capacitance Crss). It is noted that energy loss other than the conduction loss resulted from the on-resistance is positive correlated to the inter-electrode capacitance and the operation frequency of the power MOSFET. Therefore, in order to increase the operation frequency, the inter-electrode capacitance of the power MOSFET should be reduced so as to prevent the increasing of energy loss.

FIGS. 1A to 1H are schematic views showing the fabrication method of a typical trench power MOSFET. An N-type power MOSFET is taken for example. As shown in FIG. 1A, an N-type epitaxial layer 120 is firstly formed on an N-type silicon substrate 110. Then, the location of gate trenches 130 is defined by using a mask and the dry etching process is carried out to form a plurality of gate trenches 130 in the epitaxial layer 120.

Afterward, referring to FIG. 1B, a gate oxide layer 140 is formed to line the inner surface of the gate trench 130. Then, a polysilicon layer is deposited over all the exposed surfaces of the epitaxial layer 120 and fills the gate trenches 130. Thereafter, the etching back process is carried out to remove polysilicon material above the gate trenches 130 so as to form polysilicon gates 152 resided in the gate trenches 130. It is noted that, the upper surface of the polysilicon gate 152 is located below the upper edge of the gate trenches 130 due to the etching back process.

Afterward, referring to FIG. 1C, P-type impurities are implanted to the N-type epitaxial layer 120 by ion implantation and an implanted surface region 120a is shown. Then, referring to FIG. 1D, a thermal drive-in process is introduced to diffuse the P-type impurities to form a P-well 122 in the N-type epitaxial layer 120. It is noted that of the epitaxial layer 120 near the gate trench 130, both the upper surface and the sidewall are exposed to the implanted P-type impurities. Thus, referring to FIG. 1C, implant depth and concentration of the epitaxial layer 120 near the gate trench 130 is greater than the other portion of the epitaxial layer 120. As a result, after the drive-in step, the profile of the P-well 122 shows greater depths at the center 122a and the two edges 122b adjacent to the gate trenches 130.

Afterward, referring to FIG. 1E, a photo-resist pattern 162 for defining the source is formed on the epitaxial layer 120 by using a source mask (not shown). Then, N-type impurities are implanted to the P-well 122 by ion implantation to form a plurality of N-type source regions near the exposed surface of the P-well 122 and adjacent to the sidewalls of the gate trenches 130.

Thereafter, referring to FIG. 1F, a dielectric layer 170, such as a BPSG layer, is deposited over all the exposed surfaces to cover the polysilicon gates 152, the source regions 160, and the exposed P-well 122. Then, a contact window 172 is formed in the dielectric layer 170 by using lithography and etching process to expose the source regions 160 and the P-well 122.

Thereafter, referring to FIG. 1G, P-type impurities are implanted through the contact window 172 to the P-well 122 to form a P-type heavily doped region 180 at the upper portion of the P-well 122. Finally, referring to FIG. 1H, a metal layer 190 is deposited over the dielectric layer 170 and fills the contact window 172 to cover the source region 160 at the bottom of the contact window 172.

However, referring to FIGS. 1C and 1D, because the epitaxial layer 120 has higher impurity concentration and greater implantation depth near the gate trenches 130, the profile of the P-well 122 must have greater depths at the both edges 122b adjacent to the gate trenches 130. Such impurity distribution is bad for implant profile control. The bottom of the gate trenches 130 should be connected to the N-type epitaxial layer 120 under the P-well 122. Because the epitaxial layer 120 has a higher impurity concentration and a greater implantation depth near the gate trenches 130, it is hard to control the diffusion of P-type impurities during the drive-in step to expand the P-type region downward and prevent the bottom of the gate trenches 130 from being covered by the P-well 122 at the same time.

Accordingly, how to improve the depth profile of the well of the metal oxide semiconductor field effect transistor to prevent the bottom of the gate trenches from being covered by the well to result in failure is a topic eager to be resolved.

SUMMARY OF THE INVENTION

It is a main object of the present invention to improve the profile of the well of the trench metal oxide semiconductor transistor so as to prevent the bottom of the gate trench from being covered by the well to result in failure.

It is another object of the present invention to provide a fabrication method of a trench metal oxide semiconductor field effect transistor, which is capable of effectively controlling the depth profile of the well of the trench metal oxide semiconductor field effect transistor.

To achieve the above mentioned objects, a fabrication method of a trench metal oxide semiconductor transistor is provided in the preset invention. Firstly, an epitaxial layer of a first conductivity type is formed over a silicon substrate. Then, a plurality of first trenches is formed in the epitaxial layer. Afterward, impurities of the first conductivity type are implanted into the epitaxial layer by a blanket implantation process. Thereafter, a polysilicon pattern is formed on the epitaxial layer by using lithography and etching process through a polysilicon mask. The polysilicon pattern fills the first trenches and covers a predetermined range of the epitaxial layer surrounding the first trenches. Then, impurities of a second conductivity type are implanted into the epitaxial layer through the polysilicon pattern. Afterward, the impurities implanted in the epitaxial layer are driven in to form a well with the second conductivity type. Thereafter, impurities of the first conductivity type are implanted into the well through the polysilicon pattern to form a plurality of first doped regions. Then, the impurities in the first doped regions are driven in to form a plurality of source regions adjacent to the first trenches respectively. Afterward, a portion of the polysilicon pattern located above an upper surface of the epitaxial layer is removed to leave a plurality of polysilicon gates in the first trenches respectively. Thereafter, a dielectric layer is deposited over all the exposed surfaces and a contact window is formed in the dielectric layer to expose the source regions. Then, a metal layer is deposited over the dielectric layer to cover the exposed source regions.

A trench metal oxide semiconductor transistor is also provided in the present invention. The trench metal oxide semiconductor transistor has an epitaxial layer of a first conductivity type, a plurality of first trenches, a plurality of polysilicon gates, a plurality of wells with a second conductivity type, a plurality of source regions of the first conductivity type, a dielectric layer, and a metal layer. Wherein, the first trenches are located in the epitaxial layer, the polysilicon gates are located in the first trenches respectively, and the well is located between the neighboring first trenches. The well has a convex protruding downward corresponding to at a center between the neighboring first trenches, and has a minimum depth at a boundary thereof adjacent to a sidewall of the first trench. The source regions are adjacent to the respective first trenches respectively. The source region has a depth profile showing a curved surface due to thermal diffusion. The dielectric layer is located on the epitaxial layer to cover the polysilicon gates and has at least a contact window to expose the source region. A metal layer is located on the dielectric layer and the exposed source region.

BRIEF DESCRIPTION OF THE DRAWINGS

The present invention will now be specified with reference to its preferred embodiment illustrated in the drawings, in which.

DETAILED DESCRIPTION OF PREFERRED EMBODIMENTS

Figure 2A:
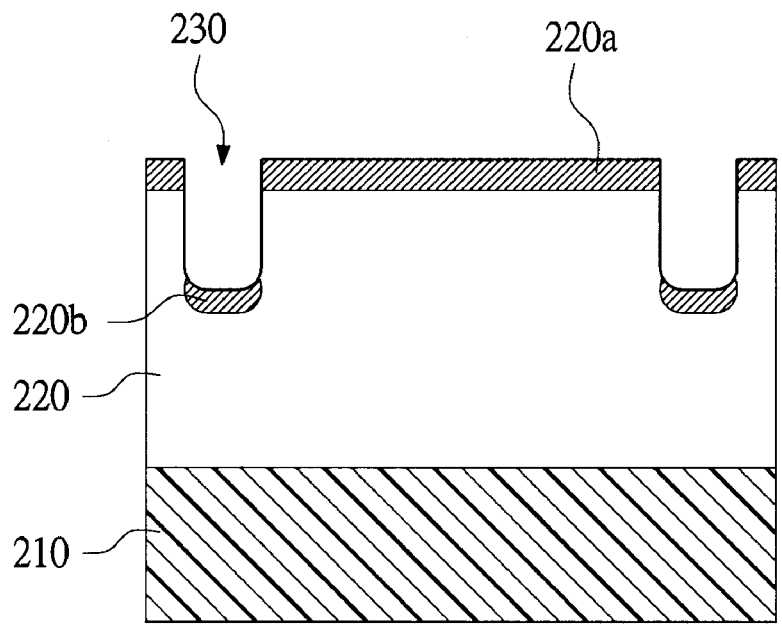
FIGS. 2A to 2H are schematic views showing a preferred embodiment of a fabrication method of a trench metal oxide semiconductor transistor in accordance with the present invention.

FIGS. 2A to 2H are schematic views showing a preferred embodiment of a fabrication method of the trench metal oxide semiconductor transistor in accordance with the present invention. N-type metal oxide semiconductor transistor is taken for example. Referring to FIG. 2A, firstly, an N-type epitaxial layer 220 is formed over an N-type silicon substrate 210. Afterward, the location of gate is defined on the epitaxial layer 220 by using a mask (not shown) and a dry etch process is carried out to form a plurality of gate trenches 230 in the epitaxial layer 220. Thereafter, N-type impurities are implanted to the surface region 220a of the epitaxial layer 220 and the bottom region 220b of the gate trench 230 by using the blanket implant technology.

Figure 2B:
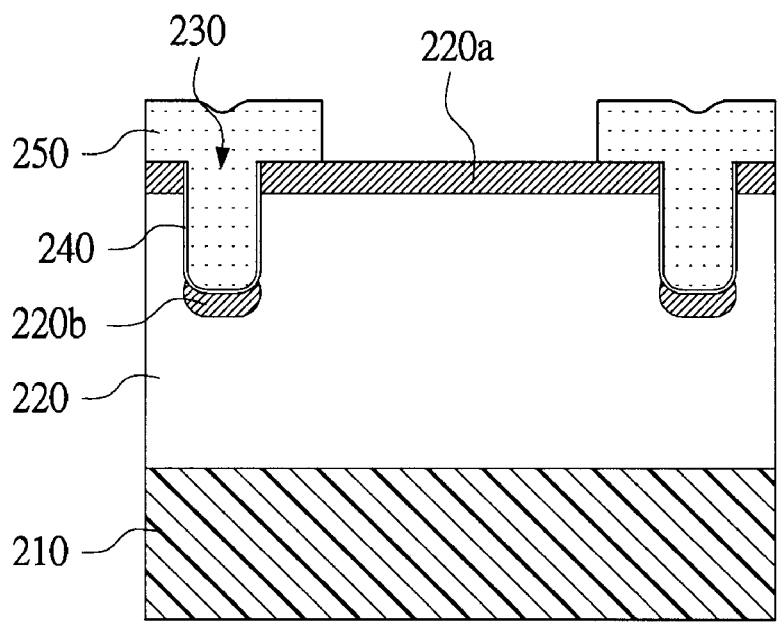

Thereafter, referring to FIG. 2B, a gate oxide layer 240 is formed on the inner walls of the gate trenches 230. Then, a polysilicon pattern 250 is formed on the epitaxial layer 220 to fill the gate trenches 230 and covers a predetermined range of the epitaxial layer 220 surrounding the gate trenches 230 through a polysilicon mask by using lithography and etching process. Afterward, referring to FIG. 2C, P-type impurities are implanted into the epitaxial layer 220 through the polysilicon pattern layer 250 by ion implantation. Then, the implanted impurities (including the blanket implanted N-type impurities and the P-type impurities implanted through the polysilicon pattern 250) in the epitaxial layer 220 are driven in to form a P-well 222.

It is noted that, the polysilicon pattern 250 not only fills the gate trenches 230 but also covers the epitaxial layer 220 surrounding the gate trench 230 within a predetermined range as shown in FIG. 2B. Therefore, the implanted P-type impurities are segregated in a range right below the opening 250a of the polysilicon pattern 250. That is, no high concentration P-type impurity implant exists in the epitaxial layer 220 near the gate trenches 230. In addition, in the following drive-in process, the implanted P-type impurities are diffused from the epitaxial layer 220 below the opening 250a of the polysilicon pattern 250 inside the epitaxial layer 220 or toward the sidewall of the gate trenches 230. As a result, referring to FIG. 2C, the P-well 222 formed after the drive-in process has a depth profile showing a tendency of reducing depth from the center 222a to the boundaries 222b thereof. As a preferred embodiment, the P-well 222 has a minimum depth at the boundaries adjacent to the gate trenches 230.

Figure 2C:
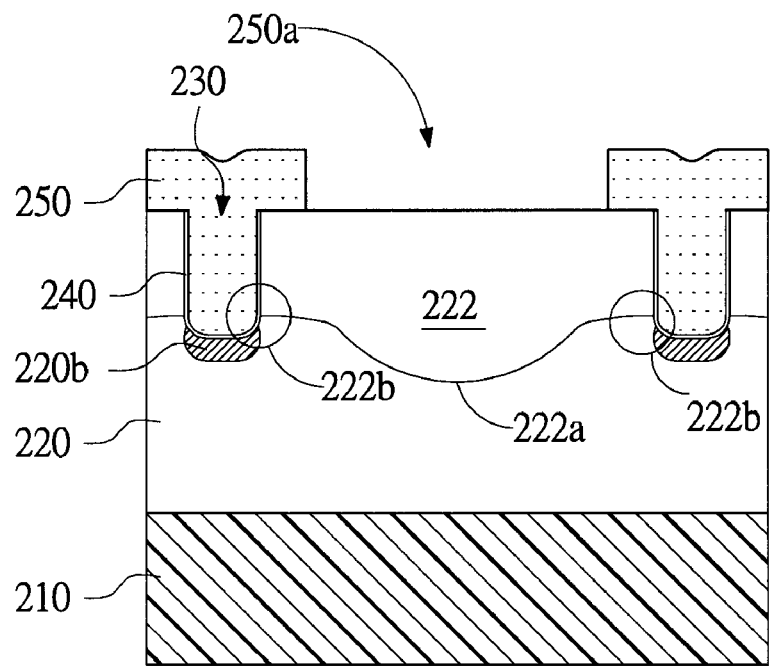

Although there are N-type impurities implanted to the surface region 220a of the epitaxial layer 220 as shown in FIG. 2A, because the concentration of the implanted N-type impurities is much lower than the P-type impurities implanted in the following step as shown in FIG. 2C, the existence of the N-type blanket implant would not deter the formation of the P-well 222. On the contrary, the N-type blanket implant would be good for the depth profile of the P-well 222. In detail, before the formation of the P-well 222, the surface region 220a of the epitaxial layer 220 showing a uniform distribution of N-type impurity concentration besides a greater concentration near the gate trenches 230. The greater concentration of the N-type impurities near the gate trenches 230 may hinder the thermal diffusion of the P-type impurities during the drive-in step so as to reduce the diffusion distance near the gate trenches 230.

Figure 2D:
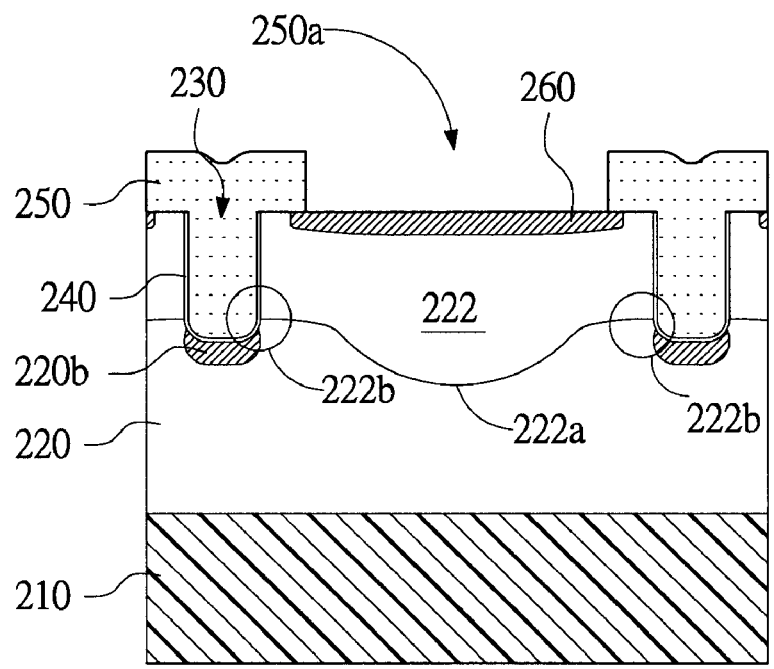
Figure 2E:
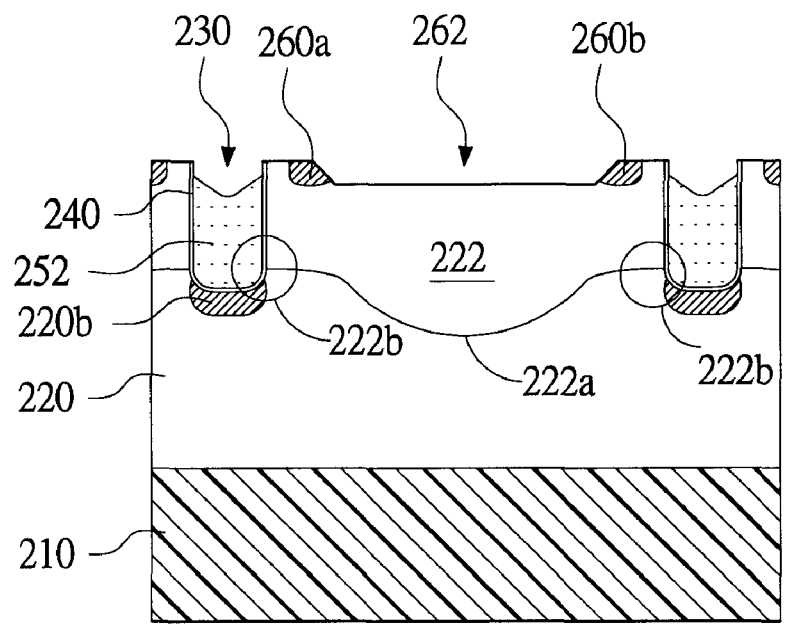

Afterward, referring to FIG. 2D, N-type impurities are implanted into the P-well 222 through the polysilicon pattern 250 to form a plurality of first doped regions 260 by ion implantation. Then, referring to FIG. 2E, a portion of the polysilicon pattern 250 above an upper surface of the epitaxial layer 220 is removed by dry etch to leave a plurality of polysilicon gates 252. It is noted that in the dry etch process, all the exposed surfaces including the exposed first doped region 260 are etched. Therefore, a hollow 262 is formed on the upper surface of the well 222 right below the openings 250a of the polysilicon pattern 250 simultaneously with the removal of the polysilicon pattern 250. The depth of the hollow 262 is related to the thickness of the polysilicon pattern 250. Therefore, it is able to adjust the depth of the first doped region 260 and the thickness of the polysilicon pattern 250 to have the hollow 262 dividing the first doped region 260 into two separated portions 260a and 260b corresponding to the polysilicon gates 252 at the opposite sides of the well 222.

Figure 2F:
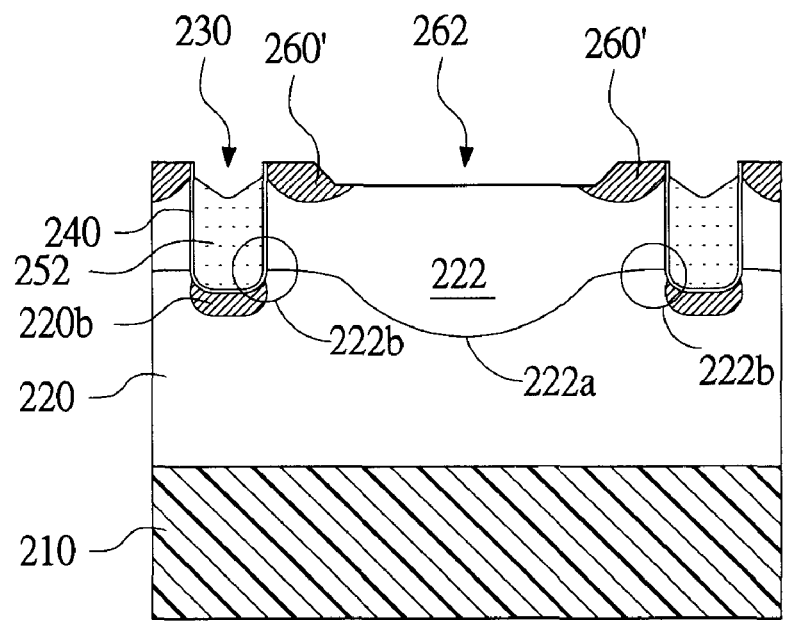

Thereafter, referring to FIG. 2F, the impurities in the two portions 260a and 260b of the first doped region are driven in so as to expand the range of the doped regions 260a and 260b toward the polysilicon gates 252 to form a plurality of source doped regions 260'. One side of the source region 260' is adjacent to the sidewall of the hollow 262 and the other side is adjacent to the gate trench 230. Afterward, referring to FIG. 2G, a dielectric layer 270 is deposited over all the exposed surfaces and a contact window 272 is formed in the dielectric layer 270 to expose the source regions 260'. Then, P-type impurities are implanted into the P-well 222 through the contact window 272 to form a second doped region 280 adjacent to a bottom surface of the hollow 262. Finally, referring to FIG. 2H, a metal layer 290 is deposited over the dielectric layer 270 and filled into the contact window 272 to cover the source regions 260' so as to finish the fabrication method.

Figure 3A:
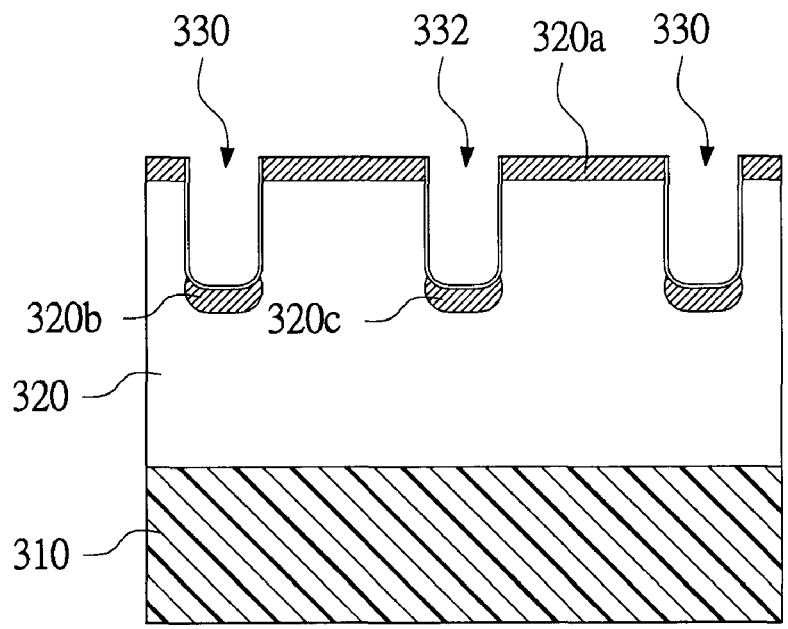
FIGS. 3A to 3H are schematic views showing another preferred embodiment of a fabrication method of a trench metal oxide semiconductor transistor in accordance with the present invention.

FIGS. 3A to 3H are schematic views showing another preferred embodiment of a fabrication method of the trench metal oxide semiconductor transistor in accordance with the present invention. An N-type metal oxide semiconductor transistor is taken for example. Referring to FIG. 3A, firstly, an N-type epitaxial layer 320 is formed on an N-type silicon substrate 310. Afterward, the location of gates (gate trenches 330) is defined by using a mask (not shown). The mask also defines the location of second trench between neighboring gates. Then, a dry etching process is carried out to form a plurality of gate trenches 330 in the epitaxial layer 320 and at least one second trench 332 located between two neighboring gate trenches 330. Thereafter, N-type impurities are implanted to the surface region 320a of the epitaxial layer 320 and the bottom regions 320b and 320c of the gate trench 330 and the second trench 332 respectively by using blanket implant technology.

Figure 3B:
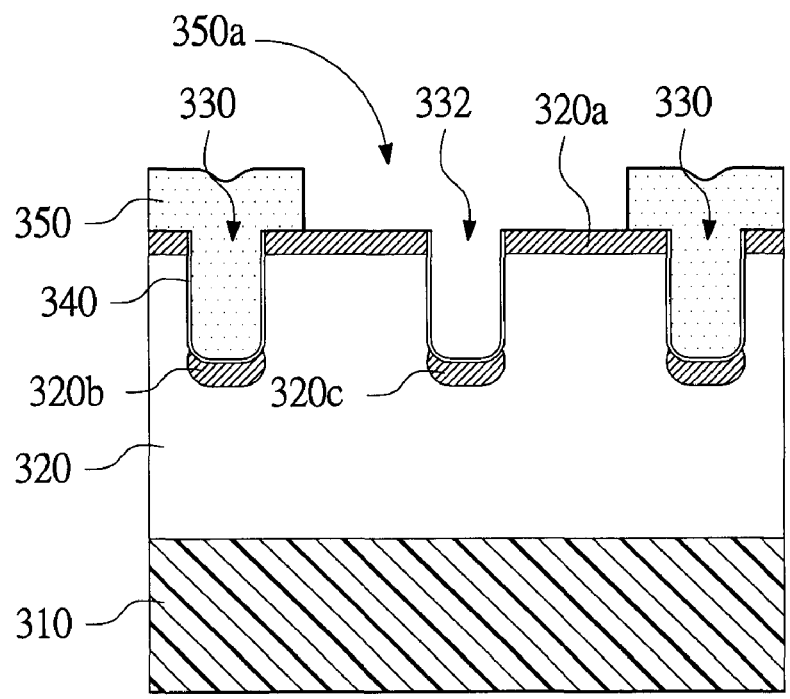

Afterward, referring to FIG. 3B, a gate oxide layer 340 is formed on the inner walls of the gate trenches 330. Afterward, a polysilicon pattern 350 is formed on the epitaxial layer 320 to fill the gate trenches 330 and cover a predetermined range of the epitaxial layer 320 surrounding the gate trenches 330 by using a polysilicon mask (not shown). It is noted that the polysilicon pattern 350 does not cover the second trench 332 and most of the upper surface of the epitaxial layer 320 is remained exposed.

Figure 3C:
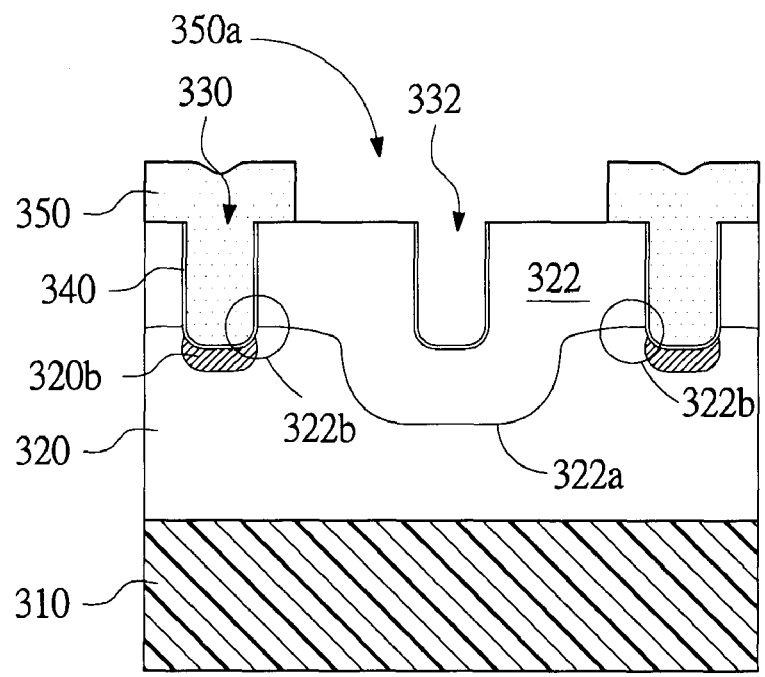

Thereafter, referring to FIG. 3C, P-type impurities are implanted into the epitaxial layer 320 through the polysilicon pattern 350 by ion implantation. The implanted regions include the bottom region 320c of the second trench 332. Then, the implanted impurities (including the N-type impurities and the P-type impurities) in the epitaxial layer 320 are driven in to form a P-well 322.

Referring to FIG. 3B, the polysilicon pattern 350 not only fills the gate trench 330 but also covers a predetermined range of the epitaxial layer 320 surrounding the gate trench 330. Therefore, the implanted P-type impurities are segregated in a range right below the opening 350a of the polysilicon pattern 350. That is, no high concentration P-type impurity implant exists in the epitaxial layer 320 near the gate trenches 330. In addition, in the following drive-in process, the implanted P-type impurities are gradually diffused from the epitaxial layer 320 below the opening 350a of the polysilicon pattern 350 inside the epitaxial layer 320 and toward the sidewall of the gate trenches 330. As a result, referring to FIG. 3C, the P-well 322 formed after the drive-in process has a depth profile showing a tendency of reducing depth from the center 322a to the boundaries 322b thereof. As a preferred embodiment, the P-well 322 has a minimum depth at the boundaries adjacent to the gate trenches 330.

The N-type impurities have been implanted to the surface region 320a of the epitaxial layer 320 and the bottom region 320c of the second trench 332 before the formation of the P-well 322 as shown in FIG. 3A. The surface region 320a of the epitaxial layer 320 showing a uniform distribution of N-type impurity concentration besides a greater concentration near the gate trenches 330. The greater concentration of the N-type impurities near the gate trenches 330 may hinder the thermal diffusion of the P-type impurities during the drive-in step so as to reduce the diffusion distance near the gate trenches 330.

Moreover, in the present embodiment, the additional second trench 332 is formed between the neighboring gate trenches 330. In the selective ion implantation process as shown in FIG. 3C, some of the P-type impurities are implanted to the bottom of the second trench 332. Therefore, the depth profile of the P-well 322 has convex protruding downward at the center 332a thereof, which is corresponding to the location of the second trench 332. In addition, referring to FIG. 3A, because N-type impurities have been implanted to the bottom region 320c of the second trench 332 before the formation of the P-well 322, the drive-in distance of the P-type impurities for forming the P-well 322 is hindered by the N-type impurities in the bottom region 320c of the second trench 332 so as to have the P-well 322 corresponding to the location of the second trench 332 showing a minimum thickness, which is understood as the distance between the bottom of the second trench 332 and the lower edge of the P-well 322.

Figure 3D:
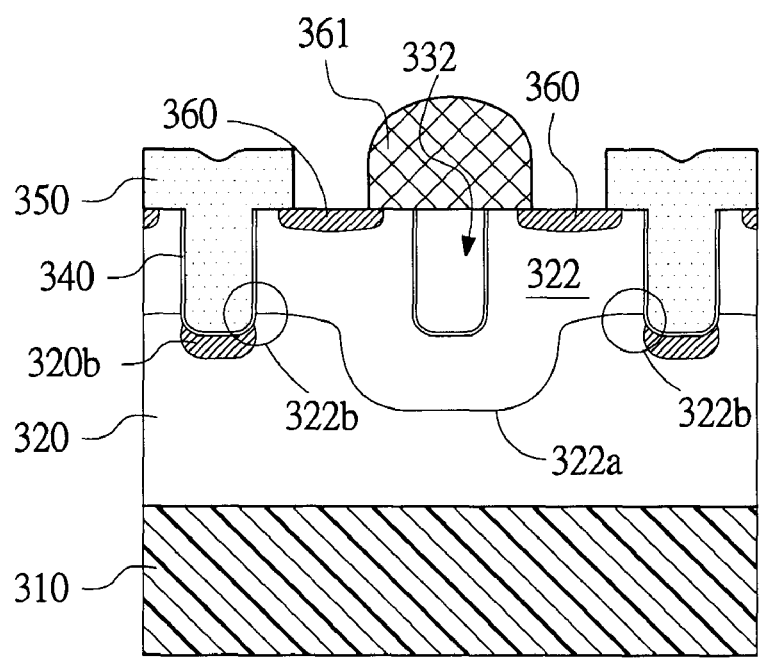
Figure 3E:
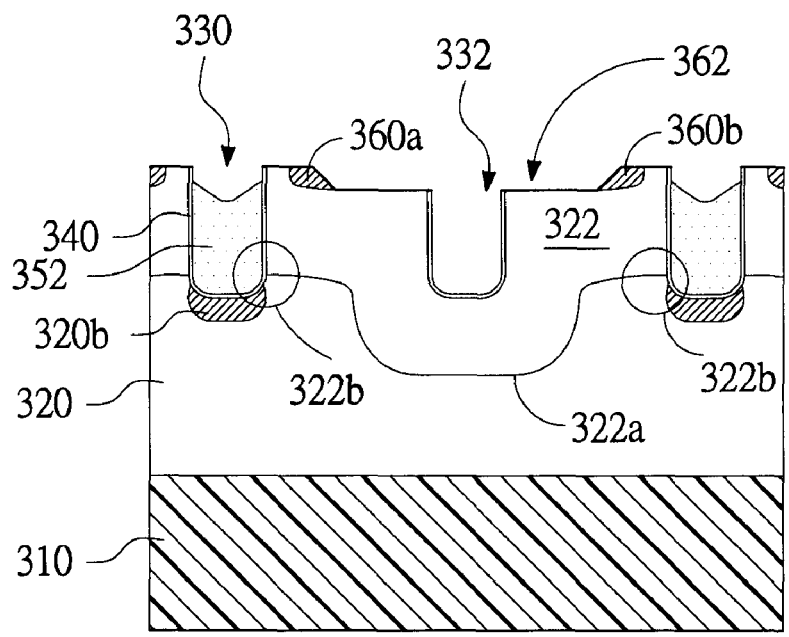

Afterward, referring to FIG. 3D, a photo-resist pattern 361 is formed on the epitaxial layer 320 to cover the second trench 332 and the neighboring P-well 322 by using a source mask. It is noted that there is a gap between the polysilicon pattern 350 and the photo-resist pattern 361 to expose the P-well 322. Then, N-type impurities are implanted into the P-well 322 through the polysilicon pattern 350 and the photo-resist pattern 361 to form a plurality of first doped regions 360. Then, referring to FIG. 3E, the photo-resist pattern 361 and the portion of the polysilicon pattern 350 above the upper surface of the epitaxial layer 320 are removed in a serial to leave the polysilicon gates 352 in the gate trenches 330.

It is noted that the above mentioned blanket etching process removes the portion of the polysilicon pattern 350 above the upper surface of the epitaxial layer 320 and also etches the exposed first doped regions 360. Thus, the portion of the first doped regions 360 right below the opening 350a of the polysilicon pattern 350 is removed to form a hollow 362 on the epitaxial layer 320. Referring to FIG. 3D, because the first doped regions 360 have some lateral expansion with respect to the range defined by the opening 350a of the polysilicon pattern 350, portions of the first doped regions 360a and 360b are left by the sidewalls of the hollow 362 in the epitaxial layer 320 after the etching process.

Figure 3F:
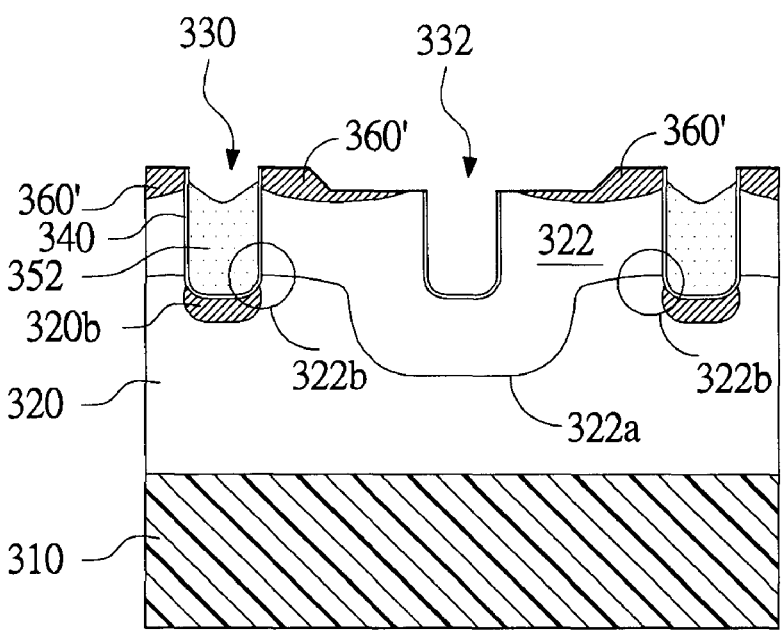

Afterward, referring to FIG. 3F, the N-type impurities in the doped regions 360a and 360b are driven in to have the range of the doped regions 360a and 360b expanded toward the polysilicon gate 352 to form source regions 360'. One side of the source region 360' is adjacent to the sidewall of the hollow 362 and the other side is adjacent to the gate trench 330. It is noted that the location of the doped regions 360a and 360b are decided by the opening of the polysilicon pattern 350 as shown in FIG. 3D. In addition, referring to FIG. 3B, the diffusion distance of the impurities in the doped regions 360a and 360b should be taken into concern when deciding the predetermined range of the epitaxial layer 320 which the polysilicon pattern 350 covers. That is, for the formation of the source regions 360', the predetermined range should be substantially smaller than the diffusion distance of the impurities in the doped regions 360a and 360b.

Figure 3G:
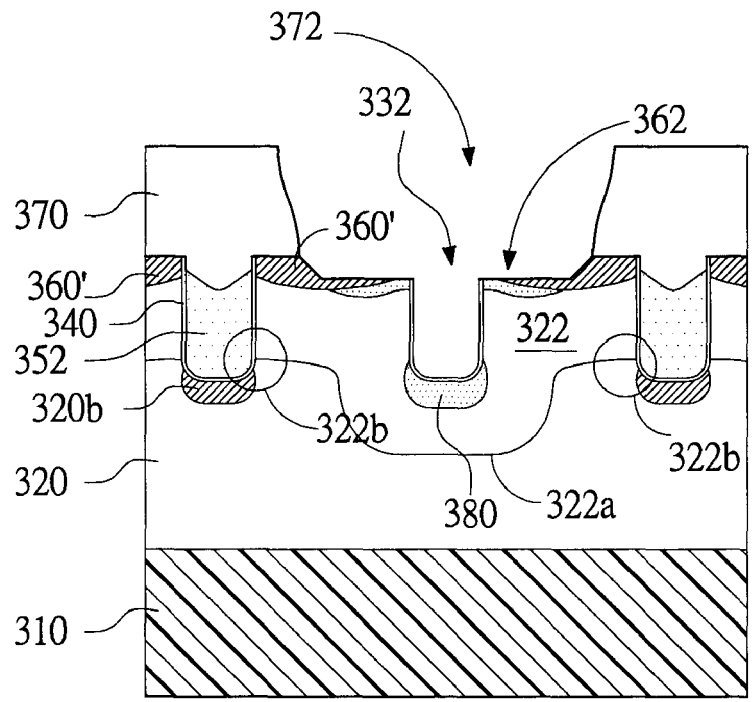

Thereafter, referring to FIG. 3G, a dielectric layer 370 is deposited over all the exposed surfaces and a contact window 372 is formed in the dielectric layer 370 to expose at least part of the source regions 360'. Then, P-type impurities are implanted into the P-well 322 through the contact window 372 to form the second doped region 380. Finally, referring to FIG. 3H, a metal layer 390 is formed over the dielectric layer 370 and filled into the contact window 372 to cover the source regions 360' so as to finish the fabrication method.

In the present embodiment, the gate trench 330 and the second trench 332 are simultaneously formed in a lithography and etching step. However, this should not be construed as limiting the scope of the present invention. The gate trenches 330 and the second trench 332 may be formed individually by using two lithographic and etching steps. In addition, the depth of the second trench 332 should not be identical to that of the gate trench 330.

Moreover, in the present embodiment, the second trench 332 is located at the middle between the two neighboring gate trenches 330 and there has only one second trench 332 located between the two neighboring gate trenches 330. Besides, the opening size of the second trench 332 is substantially identical to that of the gate trench 330. However, this should not be construed as limiting the scope of the present invention. If there is enough space left between the neighboring gate trenches 330, the opening size of the second trench 332 may be enlarged and the number of the second trench 332 between neighboring gate trenches 330 may be increased to adjust the depth profile of the P-well 322.

Figure 2G:
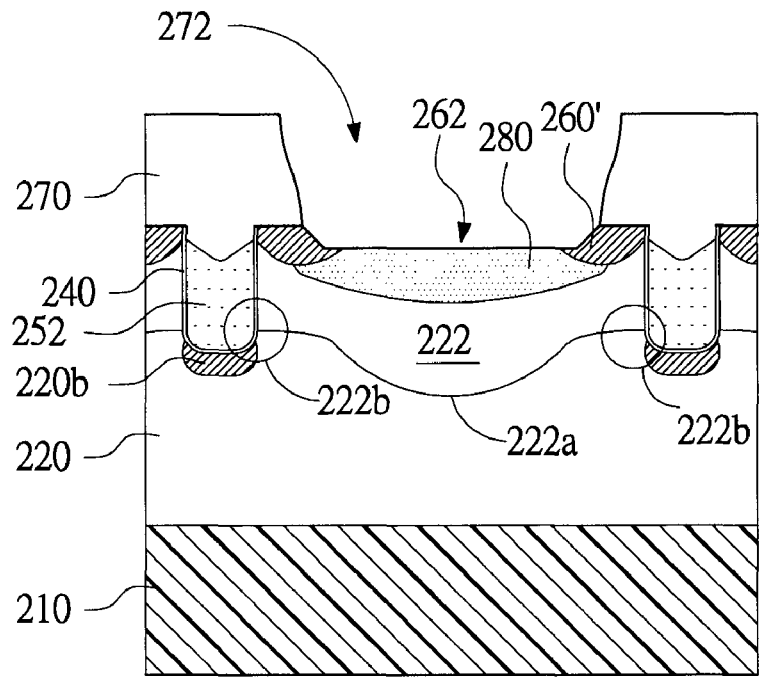
Figure 2H:
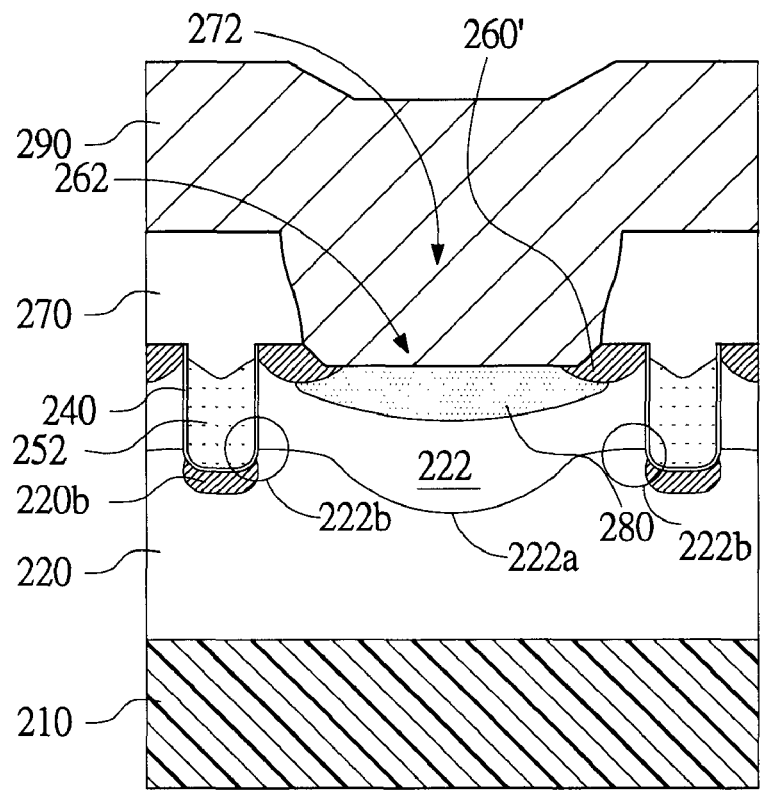
Figure 3H:
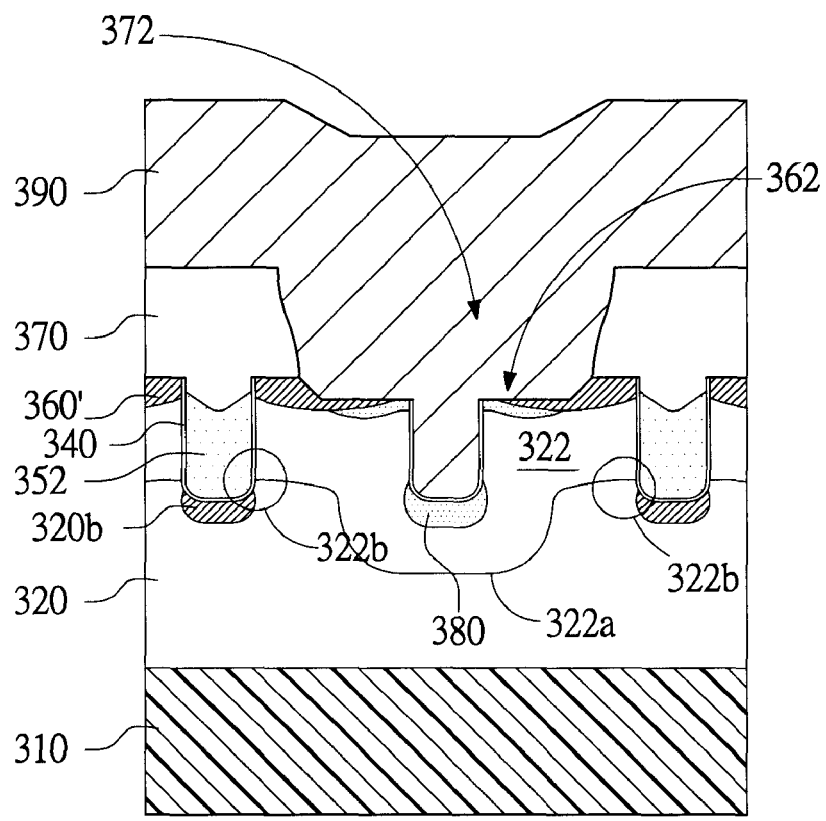

In addition, referring to FIGS. 2H and 3H, the depth at the center 222a, 322a of the depth profile of the P-well 222, 322 is greater than the depth of the gate trench 230, 330. However, this should not be construed as limiting the scope of the present invention. When the technology of deep trench gate is used, the depth at the center 222a, 322a of the P-well 222, 322 may be smaller than the depth of the gate trench 230, 330.

Figure 4A:
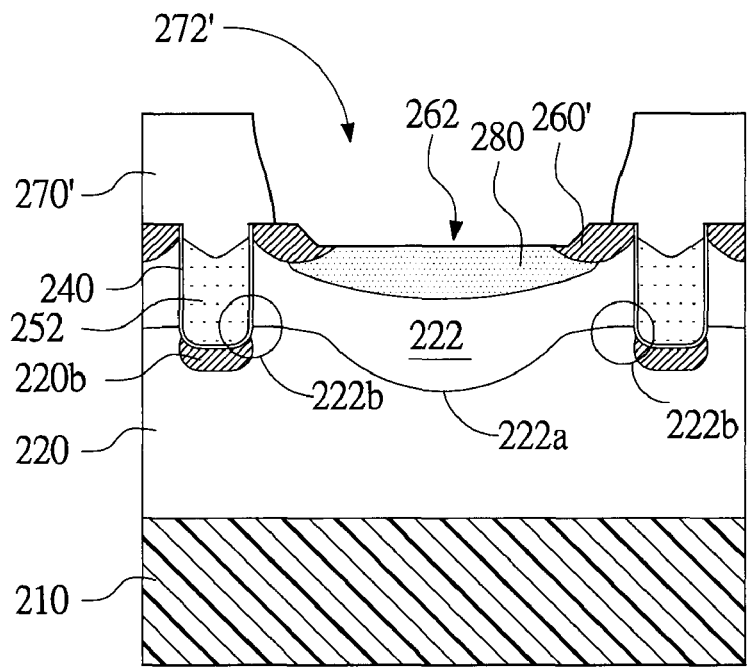
FIGS. 4A and 4B are schematic views showing yet another preferred embodiment of a fabrication method of a trench metal oxide semiconductor transistor in accordance with the present invention.
Figure 4B:
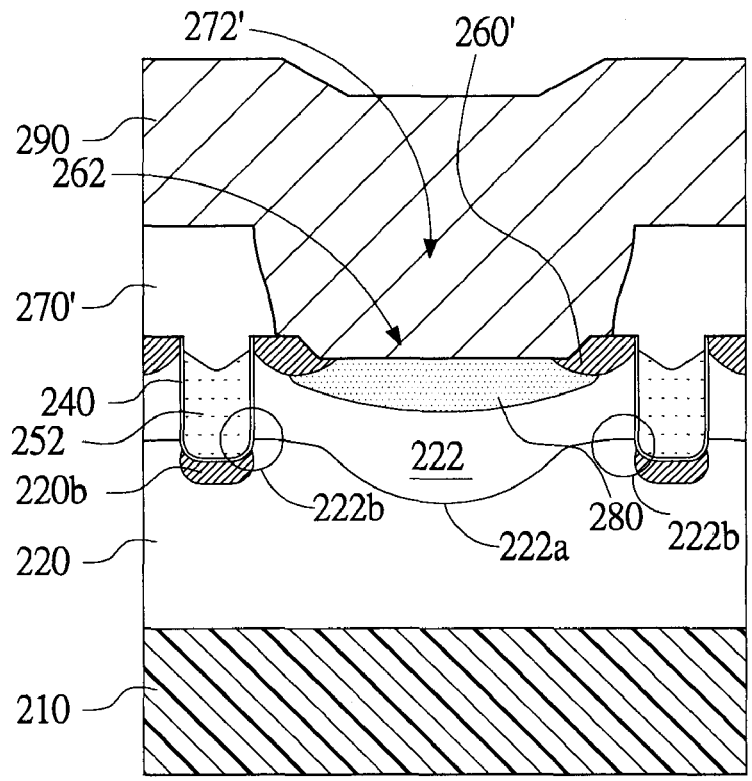

Moreover, referring to FIGS. 2G and 3G, to ensure that the source regions 260', 360' are electrically connected to the metal layer 290, 390, the size of the contact window 272, 372 can not be smaller than the size of the hollow 262, 362 on the epitaxial layer 220, 320. In addition, referring to FIGS. 4A and 4B, in order to increase the joint surface between the source region 260' and the metal layer 290, the contact window 272' in the dielectric layer 270' would be enlarged to have the hollow 262 situated in a space defined by the sidewalls of the contact window 272' and to expose the upper surface of the source regions 260'.

Furthermore, referring to FIGS. 2E, 2F, 3E, and 3F, the fabrication method provided in the present invention applies thermal drive-in process to the doped regions 260a, 260b, 360a, and 360b to form the source regions 260' and 260' adjacent to the sidewall of the polysilicon gates 252 and 352. Therefore, the depth profile of the source regions 260' and 360' shows a curved surface on a lower edge thereof due to thermal diffusion of impurities. Also referring to FIGS. 2D and 3D, the first doped regions 260 and 360 are formed in the wells 222 and 322 through the polysilicon patterns 250 and 350. In addition, after the portion of the polysilicon patterns 250 and 350 above the upper surface of the epitaxial layers 220 and 320 have been removed by etching, part of the first doped regions 260 and 360 is remained below the hollows 262 and 362 on the epitaxial layers 220 and 320. Thus, the depth profile of the source regions 260' and 360' shows a maximum depth at the location below the openings 250a and 350a of the polysilicon patterns 250 and 350. In addition, as mentioned above, the hollows 262 and 362 are situated within a space defined by the contact windows 272 and 372 respectively, and the hollows 262 and 362 are formed when the polysilicon patterns 250 and 350 are removed by etching. The locations of the hollows 262 and 362 are respective to the openings 250a and 350a of the polysilicon pattern 250 and 350. Thus, the depth profiles of the source regions 260' and 360' show a maximum depth right beneath the contact windows 272 and 372 respectively.

It is noted that the depth profiles of the source regions 260' and 360' are influenced by the line-width of the polysilicon patterns 250 and 350, the shapes of the hollows 262 and 362, and the ion implantation and drive-in process. As the line-width of the polysilicon patterns 250 and 350 decreases, the location of maximum depth on the depth profile of the source regions 260' and 360' is shifted toward the polysilicon gates 352 and 352. As there have no first doped regions 260 and 360 left beneath the hollows 262 and 362, rest N-type impurities are diffused from the sidewalls of the hollows 262 and 362 toward the polysilicon gates 252 and 352, and the location of maximum depth on the depth profile of the source regions 260' and 360' would be shifted toward the polysilicon gates 352 and 352. As a result, the location of the maximum depth may not be located right beneath the contact windows 272 and 372.

Figure 1A:
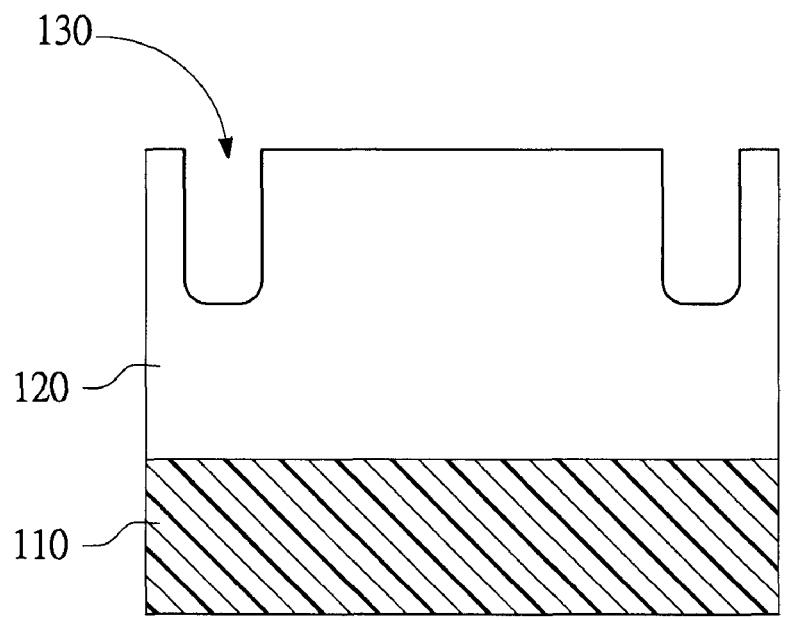
FIGS. 1A to 1H are schematic views showing a typical fabrication method of a traditional trench metal oxide semiconductor transistor.
Figure 1B:
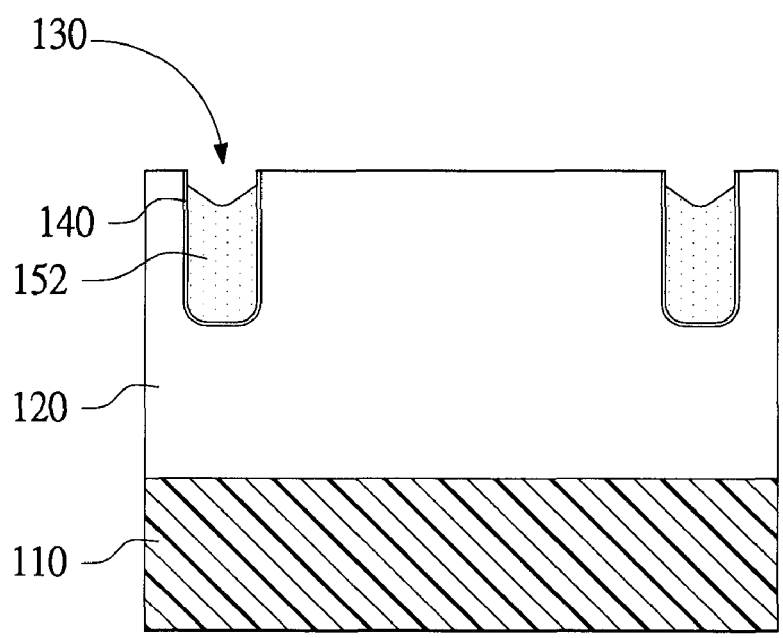
Figure 1C:
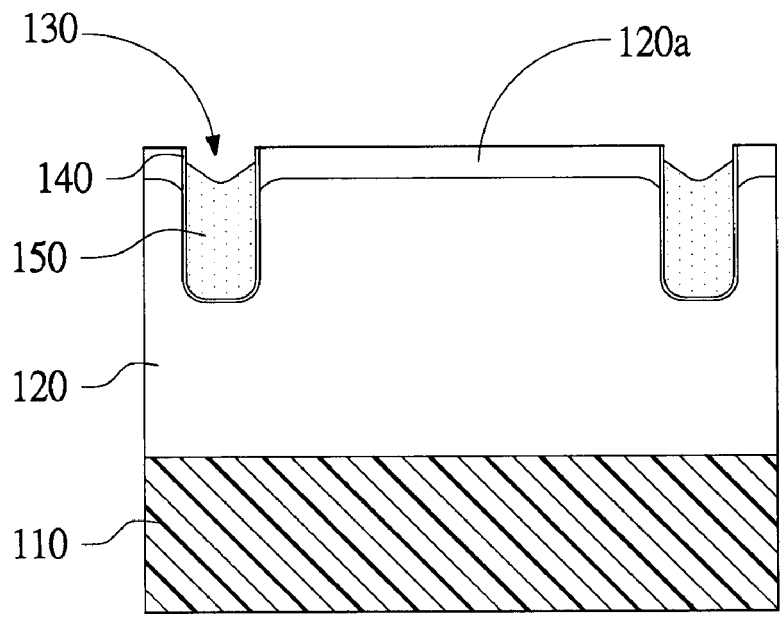
Figure 1D:
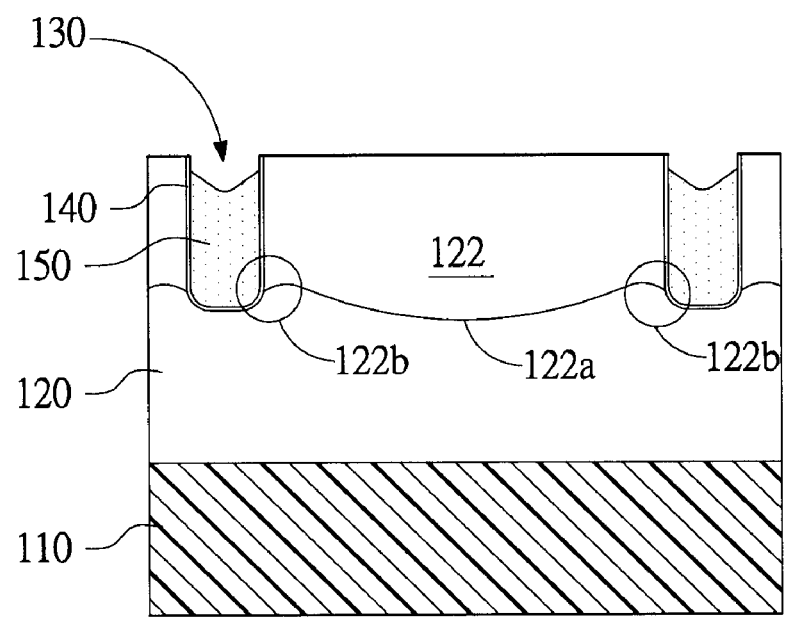
Figure 1E:
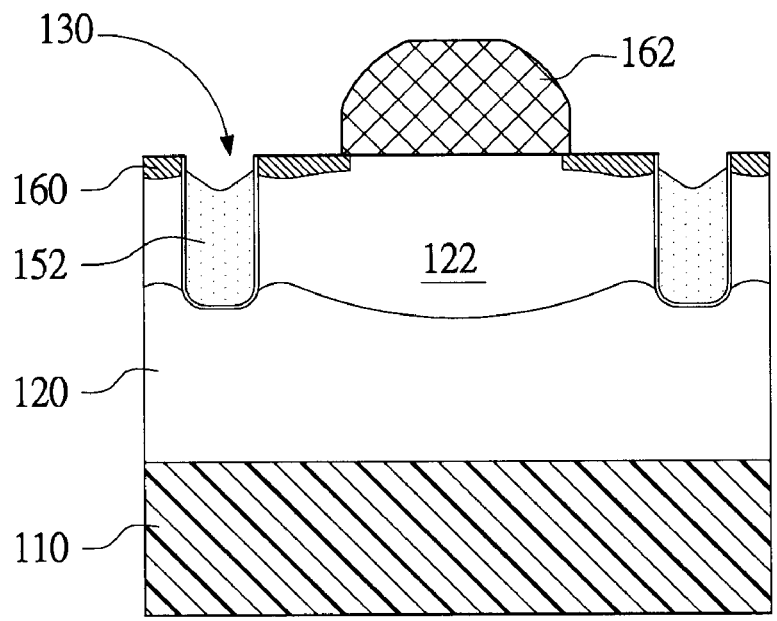
Figure 1F:
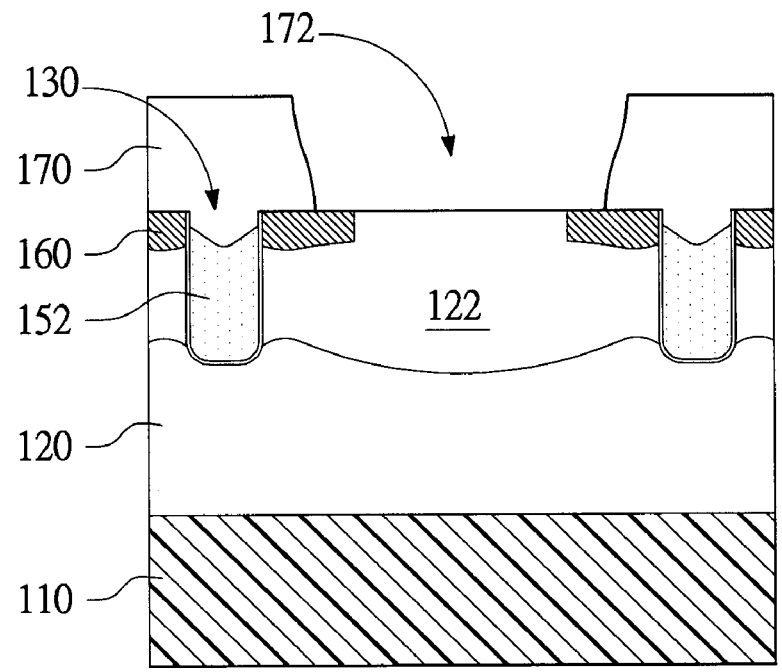
Figure 1G:
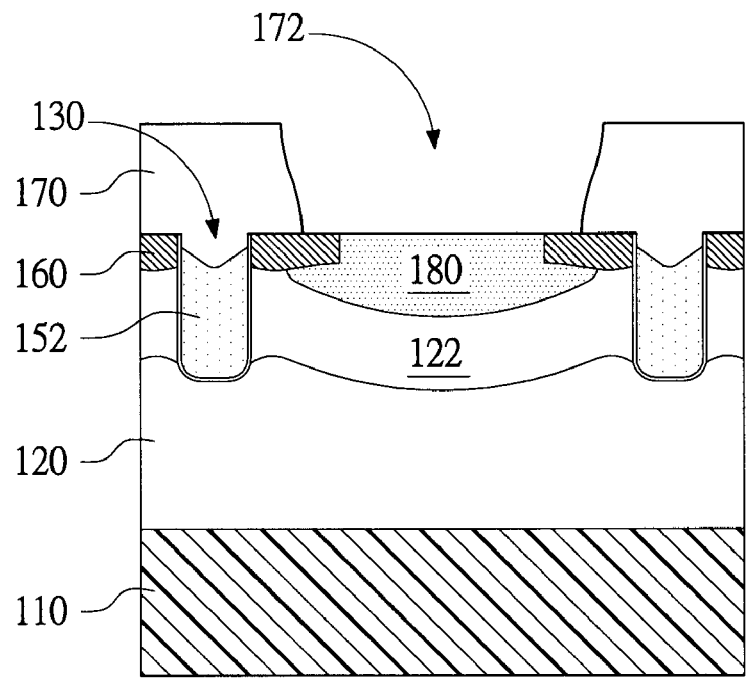
Figure 1H:
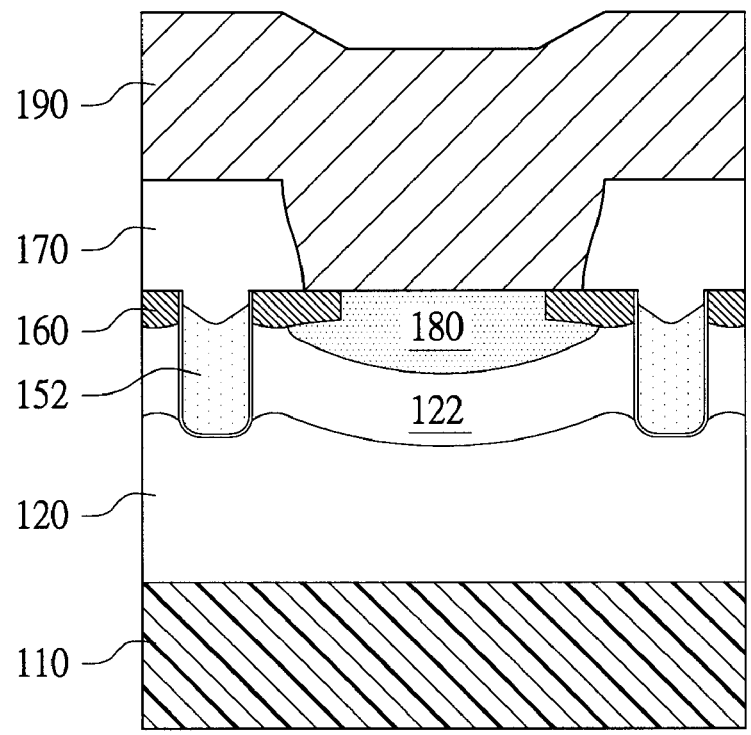

As shown in FIG. 1H, the depth profile of the P-well 122 in the typical trench metal oxide semiconductor transistor shows a greater depth at the boundaries 122b adjacent to the gate trenches 130. If the diffusion distance of the P-type impurities cannot be perfectly controlled, the conduction path would be blocked by the P-well 122 to fail the transistor. In contrast, referring to FIGS. 2H and 3H, the depth profile of the P-well 222, 322 of the trench metal oxide semiconductor transistor in the present invention shows a tendency of reducing depth from the center 222a, 322a to the boundaries 222b, 322b. Such depth profile is helpful for preventing the conduction path of the transistor from being blocked by the P-well 222, 322, and is also helpful for reducing the length of the gate trench 230, 330 so as to increase the operation frequency of the transistor.

Moreover, referring to FIG. 3H, the trench metal oxide semiconductor transistor in the present invention has an intrinsic PN diode, which is located at the center 322a of the P-well 322, between two neighboring NPN transistors, which are located at the both boundaries 322b of the P-well 322. Since the P-well 322 has a minimum thickness at the location corresponding to the PN diode, avalanche current tends to flow through the second trench 332. Therefore, the existence of the second trench 332 is helpful for preventing the trench metal oxide semiconductor transistor from being punched through by the avalanche current.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:
1. A fabrication method of a trench metal oxide semiconductor transistor comprising:
   forming an epitaxial layer of a first conductivity type over a silicon substrate;
   forming a plurality of first trenches in the epitaxial layer;
   blanket implanting impurities of the first conductivity type into the epitaxial layer;
   forming a polysilicon pattern filling the first trench and covering a predetermined range of the epitaxial layer surrounding the first trenches by using lithography and etching process through a polysilicon mask;

implanting impurities of a second conductivity type into the epitaxial layer through the polysilicon pattern;

driving in the impurities implanted in the epitaxial layer to form a well with the second conductivity type;

implanting impurities of the first conductivity type into the well through the polysilicon pattern to form a plurality of first doped regions;

driving in the impurities implanted in the first doped regions to form a plurality of source regions adjacent to the first trenches respectively;

removing a portion of the polysilicon pattern located above an upper surface of the epitaxial layer to leave a plurality of polysilicon gates in the first trenches;

depositing a dielectric layer and forming a contact window therein to expose the source regions; and depositing a metal layer over the dielectric layer to cover the exposed source regions.

2. The fabrication method of claim 1, further comprising forming a plurality of second trenches located between the neighboring first trenches in the epitaxial layer.

3. The fabrication method of claim 1, wherein before the step of forming the polysilicon pattern, further comprises a step of forming an oxide layer over all exposed surfaces of the epitaxial layer.

4. The fabrication method of claim 2, wherein after forming the well, further comprises a step of forming a photo-resist pattern covering the second trench and the neighboring well by using a source mask, and a gap is formed between the polysilicon pattern and the photo-resist pattern to expose the well.

5. The fabrication method of claim 4, wherein the first doped regions are formed by implanting impurities of the first conductivity type through the polysilicon pattern and the photo-resist pattern into the well.

6. The fabrication method of claim 1, wherein in the step of removing the portion of the polysilicon pattern above the upper surface of the epitaxial layer, part of the first doped regions at the bottom of openings in the polysilicon pattern is removed so as to have each of the first doped regions being divided into two portions respective to the two polysilicon gates at both sides of the opening.

7. The fabrication method of claim 1, wherein after forming the contact window in the dielectric layer, further comprises a step of implanting impurities of the second conductivity type into the well through the contact window to form a second doped region.

8. The fabrication method of claim 1, wherein a width of the predetermined range is substantially smaller than a drive-in distance of the impurities of the first conductivity type in the first doped region.

9. The fabrication method of claim 2, wherein in the step of blanket implanting the impurities of the first conductivity type into the epitaxial layer, the impurities of the first conductivity type are also implanted to a bottom region of the second trench.

10. A trench metal oxide semiconductor transistor comprising:
an epitaxial layer of a first conductivity type;
a plurality of first trenches, located in the epitaxial layer;
a plurality of polysilicon gates, located in the first trenches respectively;
a well of a second conductivity type, located between the neighboring first trenches, having a convex protruding downward corresponding to a center between the neighboring first trenches, and having a minimum depth at a boundary thereof adjacent to a sidewall of the first trench;
a plurality of source regions of the first conductivity type, adjacent to the first trenches respectively, and having a depth profile showing a curved surface due to thermal diffusion;
a dielectric layer, covering the polysilicon gates, and having at least a contact window to expose the source regions; and
a metal layer, located on the dielectric layer and the exposed source regions.

11. The trench metal oxide semiconductor transistor of claim 10, wherein the depth profile of the source region has a maximum depth beneath the contact window.

12. The trench metal oxide semiconductor transistor of claim 10 further comprising a second trench located between the two neighboring first trenches.

13. The trench metal oxide semiconductor transistor of claim 12, wherein the well has a minimum thickness beneath the second trench.

14. The trench metal oxide semiconductor transistor of claim 12 further comprising a second doped region with the second conductivity type located at a bottom of the second trench.

15. The trench metal oxide semiconductor transistor of claim 10 further comprising a second doped region with the second conductivity type located in the well between the source regions.

16. The trench metal oxide semiconductor transistor of claim 15, wherein the well has a hollow on an upper surface thereof located between the source regions, the hollow has sidewalls adjacent to the source regions and a bottom adjacent to the second doped region, and the hollow is located in a range defined by sidewalls of the contact window.

17. A trench metal oxide semiconductor transistor comprising:
an epitaxial layer of a first conductivity type;
a plurality of first trenches, located in the epitaxial layer;
a second trench, located between the neighboring first trenches;
a plurality of polysilicon gates, located in the first trenches respectively;
a well of a second conductivity type, located between the neighboring first trenches, having a convex protruding downward corresponding to a location of the second trench, having a minimum depth at a boundary adjacent to a sidewall of the first trench, and having a minimum thickness beneath the second trench;
a second doped region, with the second conductivity type, located at a bottom of the second trench;
a plurality of source regions with the first conductivity type, adjacent to the first trenches respectively;
a dielectric layer, covering the polysilicon gate, and having at least a contact window to expose the source regions; and
a metal layer, located on the dielectric layer and the exposed source regions.

18. The trench metal oxide semiconductor transistor of claim 17, wherein the source region has a depth profile showing a curved surface with a maximum depth located beneath the contract window.

19. The trench metal oxide semiconductor transistor of claim 17, wherein the well has a hollow on an upper surface thereof located between the source regions, the hollow has sidewalls adjacent to the source regions and is located in a range defined by sidewalls of the contact window.

20. The trench metal oxide semiconductor transistor of claim 17, wherein a depth of the second trench is identical to that of the first trench.

21. The trench metal oxide semiconductor transistor of claim 17, wherein a depth of the convex of the well is greater than that of the first trench.

* * * * *